United States Patent
Liu et al.

(10) Patent No.: US 10,158,022 B2
(45) Date of Patent: *Dec. 18, 2018

(54) BOTTOM-UP EPITAXY GROWTH ON AIR-GAP BUFFER

(71) Applicant: UNITED MICROELECTRONICS CORP., Hsin-Chu (TW)

(72) Inventors: Sheng-Hsu Liu, Changhua County (TW); Jhen-cyuan Li, New Taipei (TW); Chih-Chung Chen, Tainan (TW); Man-Ling Lu, Taoyuan (TW); Chung-Min Tsai, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/681,417

(22) Filed: Aug. 20, 2017

(65) Prior Publication Data

US 2017/0345938 A1 Nov. 30, 2017

Related U.S. Application Data

(63) Continuation of application No. 15/144,204, filed on May 2, 2016, now Pat. No. 9,780,218.

(51) Int. Cl.
| | |
|---|---|
| *H01L 29/78* | (2006.01) |
| *H01L 29/06* | (2006.01) |
| *H01L 29/165* | (2006.01) |
| *H01L 29/66* | (2006.01) |
| *H01L 21/764* | (2006.01) |

(52) U.S. Cl.
CPC ........ *H01L 29/7851* (2013.01); *H01L 21/764* (2013.01); *H01L 29/0649* (2013.01); *H01L 29/0692* (2013.01); *H01L 29/165* (2013.01); *H01L 29/66795* (2013.01); *H01L 29/7848* (2013.01); *Y02E 10/50* (2013.01)

(58) Field of Classification Search
CPC .................................................. H01L 29/0649
See application file for complete search history.

(56) References Cited

U.S. PATENT DOCUMENTS

| | | | |
|---|---|---|---|
| 8,395,217 B1 | 3/2013 | Cheng | |
| 8,937,366 B1 | 1/2015 | Han | |
| 9,780,218 B1 * | 10/2017 | Liu | ..................... H01L 29/0649 |
| 2001/0053618 A1 | 12/2001 | Kozaki | |
| 2012/0171832 A1 * | 7/2012 | Toh | ................... H01L 29/66795 |
| | | | 438/300 |
| 2015/0243745 A1 | 8/2015 | Kelly | |
| 2016/0190239 A1 * | 6/2016 | Suk | ..................... H01L 29/0649 |
| | | | 257/351 |

(Continued)

*Primary Examiner* — Eugene Lee
(74) *Attorney, Agent, or Firm* — Winston Hsu

(57) ABSTRACT

A fin structure for a semiconductor device, such as a FinFET structure, has first and second semiconductor layers and an air gap between the layers. The second semiconductor layer includes a recessed portion, the air gap is located in the recessed portion, and the recessed portion has an upwardly-opening acute angle in the range from about 10° to about 55°. The air gap may prevent current leakage. A FinFET device may be manufactured by first recessing and then epitaxially re-growing a source/drain fin, with the regrowth starting over a tubular air gap.

16 Claims, 2 Drawing Sheets

(56) References Cited

U.S. PATENT DOCUMENTS

2017/0053912 A1    2/2017  Ching
2017/0077222 A1*  3/2017  Lee ........................ H01L 21/283
2017/0077248 A1*  3/2017  Eom ................. H01L 29/41791
2017/0125410 A1*  5/2017  Li .................... H01L 21/823431
2017/0222053 A1*  8/2017  Li ........................ H01L 21/3065

* cited by examiner

BOTTOM-UP EPITAXY GROWTH ON AIR-GAP BUFFER

CROSS REFERENCE TO RELATED APPLICATIONS

This application is a continuation of application Ser. No. 15/144,204 filed on May 2, 2016, entitled "BOTTOM-UP EPITAXY GROWTH ON AIR-GAP BUFFER", and the entire content of which is hereby incorporated by reference.

BACKGROUND OF THE INVENTION

1. Field of the Invention

The present invention generally relates to semiconductor devices and methods of fabricating semiconductor devices. More particularly, the present invention relates to a fin-type field effect transistor (FinFET) device, and to a method of making a FinFET device.

2. Description of the Prior Art

The down-scaling of semiconductor devices can be observed in various types of field effect transistors. As the miniaturization of such devices has led to electrical and process limitations, techniques have been developed for maintaining and/or achieving desired performance. Among other things, a FinFET device has been developed to maintain and/or achieve improved performance with a gate of reduced dimensions. A FinFET device is described, for example, in U.S. Pat. No. 9,123,744 (Liao et al.). The entire disclosure of Liao et al. is incorporated herein by reference.

A major problem with modern electronic devices, including FinFET devices, is current leakage. It is known to incorporate a silicon-on-insulator (SOI) configuration into a semiconductor device to reduce current leakage. A known SOI-configuration device is described, for example, in U.S. Pat. No. 8,395,217 (Cheng et al.). SOI configurations may be costly, however, and they are not readily compatible with the bulk substrate configurations that are now in widespread use.

The deficiencies of the prior art devices and methods are overcome to a great extent by the inventions described herein.

SUMMARY OF THE INVENTION

According to one aspect of the present invention, a fin structure for a semiconductor device includes a first semiconductor material, an air gap, and a second semiconductor material. The semiconductor device may be, for example, a FinFET device. The first semiconductor material may be, for example, an epitaxial material grown within a fin recess. The second semiconductor material may be, for example, a substrate material, and the air gap may be located between the first and second semiconductor materials. The second semiconductor material may include a recessed portion, the air gap may be located in the recessed portion, and the recessed portion may have an upwardly-opening acute angle in the range from about 10° to about 55°.

According to another aspect of the invention, the air gap may have a tubular configuration, with a central axis that is parallel to a direction from a source region to a drain region of the fin structure. The air gap may reduce current leakage associated with the fin structure. The cross-sectional configuration of the air gap may be, if desired, like that of a lemon with two tips, or an oval.

According to another aspect of the invention, the first semiconductor material may be located in a lower recess portion, and the lower recess portion has an upwardly-opening angle in the range of from about 10° to about 55°.

According to another aspect of the invention, one or more of the fin structures may be incorporated into a FinFET device, especially a FinFET device that does not have an SOI configuration, and especially a FinFET device that is manufactured according to a process in which one or more source/drain fins are first recessed and then epitaxially re-grown.

According to another aspect of the invention, the first semiconductor material includes an SiP buffer layer, located over the air gap, and an SiP bulk layer is grown on the SiP buffer layer. If desired, a symmetrical shovel-shape element may be formed as part of the SiP bulk layer.

Additional features and embodiments, as well as additional aspects, of the present invention may be set forth or apparent from consideration of the detailed description and drawings. Moreover, it is to be understood that both the foregoing summary of the disclosure and the following detailed description are exemplary and intended to provide further explanation without limiting the scope of the present invention.

Process steps, method steps, or the like, that are described in a sequential order herein may be configured to work in alternate orders. In other words, any sequence or order of steps that may be described does not necessarily indicate a requirement that the steps be performed in that order. The steps of the processes or methods described herein may be performed in any practical order. Further, some steps may be performed simultaneously, except where explained otherwise.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
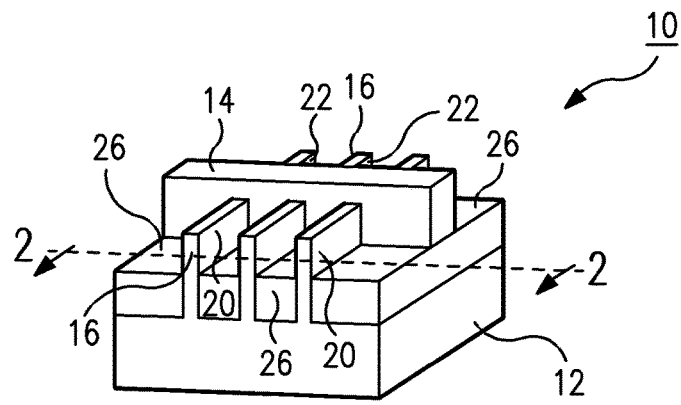
FIG. 1 is a schematic (simplified for clarity of description) perspective view of a FinFET device constructed in accordance with one aspect of the present invention.

Referring now to the drawings, where like elements are designated by like reference numerals and characters, there is shown in FIG. 1 a FinFET device 10 constructed in accordance with one aspect of the present invention. The device 10 has a silicon substrate 12, a gate 14, and three fins 16, each extending through the gate 14 and having respective source and drain regions 20, 22. The present invention is not limited to the illustrated configuration. A FinFET device constructed in accordance with the invention, may have, for example, one, two, or more than three fins 16.

Figure 2:
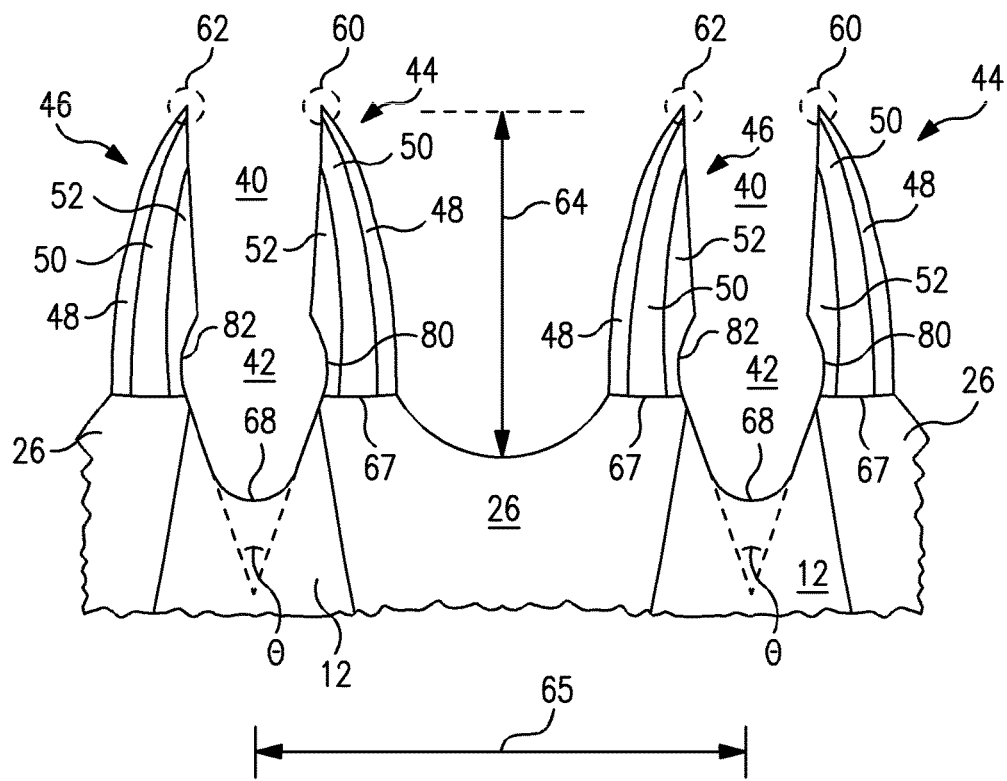
FIG. 2 is a detailed, cross-sectional view of two adjacent fins of the FinFET device of FIG. 1, at an intermediate stage of manufacture, taken along line 2-2 of FIG. 1.
Figure 3:
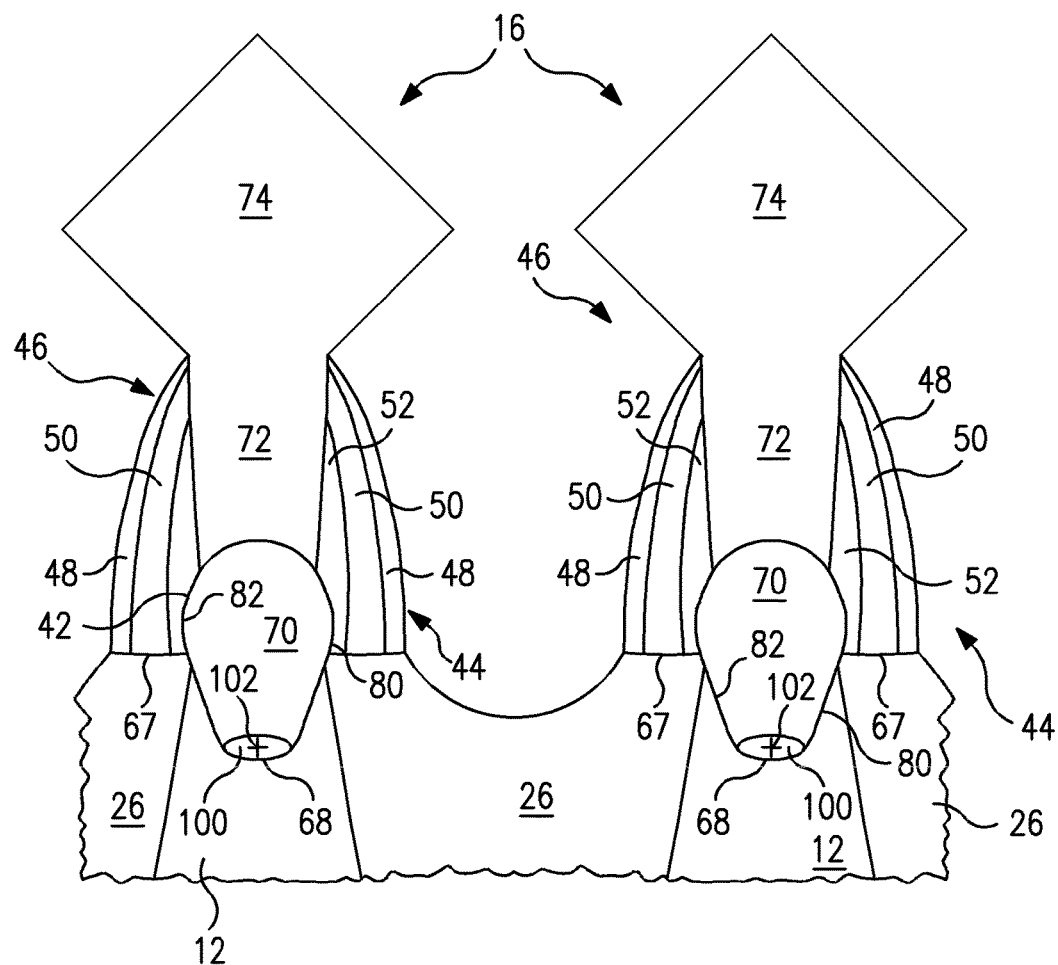
FIG. 3 is a cross-sectional view of the fins of FIG. 2, at a subsequent stage of manufacture, take along the same line 2-2 of FIG. 1.

If desired, the substrate 12 may be formed of a single-crystal silicon material or an epitaxial silicon material. If desired, the substrate 12 may be formed of one or more other materials, including but not limited to SiGe, SiC, and GaAs. The lower portions of the fins 16 are separated from each other by shallow trench isolation (STI) regions 26. The cross-sectional configuration of the surface of each STI region 26 is bowl-shaped, as shown in FIGS. 2 and 3, or V-shaped. The fin pitch 65 in the direction of line 2-2 may be, for example, 480 Å.

FIG. 2 shows two of the fins 16 at an intermediate stage of manufacture. At the illustrated stage, each fin 16 has already been subjected to processes including, preferably, but not necessarily, in this order: a silicon vertical etch process, a silicon lateral etch process, and an extra $O_2$ plasma process.

For each fin 16, a substantially-rectilinear recess portion 40 is created during the vertical etch process. A lower recess portion 42 is created during the lateral etch process. The bottom 68 of the lower recess portion 42 should be far deeper than the spacer 44, 46/STI regions 26 interface 67. The bottom 68 may be, for example, in the range of from about sixty to about one-hundred forty angstroms deeper than the interface 67. The recess portions 40, 42 are bounded by dielectric spacer walls 44, 46. Each wall 44, 46 may have, for example, a SiN layer 48 (a hard mask), a SiCN layer 50 (a hard mask), and a second SiCN layer 52 (a seal layer). The recess portions 40, 42 operate as, and are an example of, a source/drain recess for the FinFET device 10 of FIG. 1.

The purpose of the extra $O_2$ plasma process, which may involve the use of high temperature plasma, is to remove impurities from the recess portions 40, 42. Such impurities may include, but are not limited to, photoresist, C—H—F—Br—N—Si type polymer from a main etch process, C—H type polymer from a deposition process, C—H—F—N—Si type polymer from an over-etch process, C—H—Br—Si type polymer from the vertical etch process, and C—H—Cl—F—Si type polymer from the lateral etch process.

The extra $O_2$ plasma process is preferred over an in-situ $O_2$-strip process. The latter process, which would be conducted during the vertical and/or lateral etch processes, would tend to excessively oxidize and thereby excessively degrade the upper edges 60, 62 (especially the SiN spacer material 48) of the spacer walls 44, 46. In particular, the in-situ $O_2$-strip process would tend to reduce, to a non-uniform extent, the constrain spacer heights (CSH) 64 of the walls 44, 46. Different fins 16 would experience unpredictably non-uniform loss of CSH 64. The irregular height reductions (Δ CSH) could lead to abnormal (asymmetric) epitaxial growth of SiP, dislocation, and stacking faults, which could lead to device degradation and undesirable drain-induced barrier lowering (DIBL), bulk leakage (Isb), and incomplete or poorly-formed self-aligned contacts (SAC).

According to the present invention, the epitaxial growth 74 (FIG. 3) of SiP above the walls 44, 46 of each fin 16 should preferably be symmetrical. The growth 74 may be shovel-shaped, hexagonal, octagonal, or another shape, in cross section. In the example illustrated In FIG. 3, the shovel-shaped portions 74 are not merged with each other. In an alternative embodiment, the shovel-shaped portions may be merged with each other.

The extra $O_2$ plasma process, which occurs after the lateral etch process, does not tend to excessively degrade the upper edges 60, 62 (FIG. 2) of the spacer walls 44, 46. The upper edges 60, 62 are not subjected to as much oxidation during the extra $O_2$ plasma process as would be the case during the in-situ $O_2$-strip process. Consequently, use of the extra $O_2$ plasma process results in more uniform and greater CSH 64 for the fin walls 44, 46.

Moreover, use of the extra $O_2$ plasma process provides sufficient cleaning efficiency to maintain an acceptable relationship between (1) the upwardly-opening angle θ of the lower recess portion 42 and (2) ensuring that abnormal (such as asymmetrical) buffer growth is avoided. In a preferred embodiment of the invention, the upwardly-opening angle θ of the lower recess portion 42 is in the range of from about 10° to about 55°. Thus, the lower portion of the recess portion 42, in the cross-section shown in FIG. 2, is V-shaped with a rounded, not sharp, tip at the bottom surface 68.

On the other hand, the extra $O_2$ plasma process, which occurs after the lower recess portion 42 is created, may create a weakened oxidation region at the bottom surface 68 of the lower recess portion 42.

Turning now to FIG. 3, in subsequent stages of manufacture, an SiP buffer layer 70 is grown within the lower recess portion 42, and then an SiP bulk layer 72 is grown (from the bottom up) on the SiP buffer layer 70. The growth of the SiP bulk layer 72 culminates in the formation of a shovel-shape portion 74. If desired, a SiCoNi cleaning process may be performed, before initiating growth of the SiP buffer layer 70, to remove native oxide from the surface of the lower recess portion 42.

To prevent leakage from the fin 16 through the bottom 68 of the lower recess portion 42, the SiP buffer layer 70 is grown laterally inwardly from the sidewalls 80, 82 of the lower recess portion 42 to form an air gap 100. The SiP buffer layer 70 is separated to a large extent, though not completely, from the silicon substrate 12 by the air gap 100. The air gap 100 is located between the SiP buffer layer 70 and the silicon substrate 12. Although no SiP growth occurs on the fin recess bottom surface 68, small portions of the SiP buffer layer 70 on opposite sides of the air gap 100 may be, if desired, in contact with the silicon substrate 12. For the stage of manufacture illustrated in FIG. 2 through the stage of manufacture illustrated in FIG. 3, bottom-up SiP epitaxy growth within and above the recess 40, 42 proceeds without any SiP growth on the fin recess bottom surface 68.

As shown in FIG. 3, the air gap 100 is located underneath the SiP buffer layer 70. The air gap 100 may have a tubular configuration, with a central axis 102. The air gap 100 may extend along the entire lengths of the fins 16 except where the fins 16 are covered by the walls of the gate 14. For each fin 16, the air-gap central axis 102 is parallel to the direction in which the fin 16 extends from the source region 20 of the fin 16 to the drain region 22 of the fin 16. As viewed in FIG. 3, the air gap 100 may have a cross-sectional configuration like that of a lemon with two tips, or an oval shape.

In operation, the air gap 100 separates the SiP buffer layer 70 (an example of a first semiconductor material) and the silicon substrate 12 (an example of a second semiconductor material). In the illustrated embodiment of the invention, the air gap 100 occupies from about twenty percent to about eighty percent of the boundary between the first and second semiconductor materials 70, 12, and is below the lowest level of the surfaces of the STI regions 26. The air gap 100 may reduce bulk leak (Isb) within the device 10, among other things.

A known process for generating an air gap by controlling epitaxial growth within a semiconductor device is described in U.S. Pat. No. 8,395,217 (Cheng et al.). According to Cheng et al., however, the air gap is formed on a buried dielectric (BOX) layer, according to an SOI configuration. The air gap according to Cheng et al. does not separate first and second semiconductor materials.

In contrast to Cheng et al., the present invention may be implemented, if desired, without an SOI configuration. The FinFET 10 shown in FIG. 1 of the present application does not have an SOI configuration, does not have a buried dielectric layer operatively associated with the fins 16, but does have first and second semiconductor materials 70, 12 that are separated from each other by an air gap 100.

The present invention is not limited to NFET processes and devices. The present invention may be applied, if desired, to PFET (SiGe:B) processes and devices as well.

Those skilled in the art will readily observe that numerous modifications and alterations of a semiconductor device and a method of fabricating the same may be made while retaining the teachings of the various aspects of the present invention. Accordingly, the above disclosure should be construed as limited only by the metes and bounds of the appended claims.

What is claimed is:

1. A fin structure for a semiconductor device, comprising:
   a first semiconductor material;
   an air gap; and
   a second semiconductor material, wherein the second semiconductor material comprises a recessed portion, the air gap is located in the recessed portion, and the recessed portion has an upwardly-opening acute angle in the range from about 10° to about 55°;
   wherein the air gap is located between the first semiconductor material and the second semiconductor material.

2. The fin structure of claim 1, wherein the air gap has a tubular configuration.

3. The fin structure of claim 2, wherein the fin structure is elongated in a first direction, the first semiconductor material extends in the first direction, and the air gap has a central axis that is parallel to the first direction.

4. The fin structure of claim 1, wherein the air gap is located in the bottom of the recessed portion.

5. The fin structure of claim 1, wherein the second semiconductor material includes single-crystal silicon.

6. The fin structure of claim 1, wherein the first semiconductor material includes one or more of Si, phosphorus-doped Si, SiGe, SiC, and GaAs.

7. A fin-type field effect transistor (FinFET) device, comprising:
   a substrate;
   a fin having source and drain regions; and
   a gate straddling the fin;
   wherein the fin includes a first semiconductor material and an air gap;
   wherein the substrate includes a second semiconductor material, different from the first semiconductor material;
   wherein the second semiconductor material comprises a recessed portion, the air gap is located in the recessed portion, and the recessed portion has an upwardly-opening acute angle in the range from about 10° to about 55°; and
   wherein the air gap is located between the first semiconductor material and the second semiconductor material.

8. The fin-type field effect transistor (FinFET) device of claim 7, wherein the air gap has a tubular configuration.

9. The fin-type field effect transistor (FinFET) device of claim 8, wherein the fin is elongated in a first direction, the gate is elongated in a second direction, orthogonal to the first direction, and the air gap has a central axis that is parallel to the first direction.

10. The fin-type field effect transistor (FinFET) device of claim 9, wherein the first semiconductor material is located in the recessed portion, and the upwardly-opening acute angle is located in a plane that is perpendicular to the first direction.

11. The fin-type field effect transistor (FinFET) device of claim 7, wherein the second semiconductor material includes single-crystal silicon.

12. The fin-type field effect transistor (FinFET) device of claim 7, wherein the second semiconductor material includes one or more of Si, SiGe, SiC, and GaAs.

13. The fin-type field effect transistor (FinFET) device of claim 7, further comprising walls for defining a source/drain recess, and wherein said first semiconductor material is located between the walls.

14. The fin-type field effect transistor (FinFET) device of claim 13, wherein the walls include one or more hard mask and dielectric materials.

15. The fin-type field effect transistor (FinFET) device of claim 13, wherein the first semiconductor material includes an SiP buffer layer, and wherein the device further comprises an SiP bulk layer located on the SiP buffer layer.

16. The fin-type field effect transistor (FinFET) device of claim 15, further comprising a shovel-shape element, and wherein the shovel-shape element is part of the SiP bulk layer.

* * * * *